(12) United States Patent
Kim

(10) Patent No.: US 10,477,132 B2
(45) Date of Patent: Nov. 12, 2019

(54) SUCCESSIVE APPROXIMATION REGISTER ANALOG-DIGITAL CONVERTER AND SAR ADC SYSTEM

(71) Applicant: SK hynix Inc., Icheon-si (KR)

(72) Inventor: Hyeon-June Kim, Yeosu-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/204,963

(22) Filed: Nov. 29, 2018

(65) Prior Publication Data
US 2019/0166325 A1    May 30, 2019

(30) Foreign Application Priority Data
Nov. 29, 2017    (KR) .......................... 10-2017-061990

(51) Int. Cl.
*H04N 5/3745*    (2011.01)
*H03M 1/46*    (2006.01)
*H04N 5/378*    (2011.01)

(52) U.S. Cl.
CPC ........ *H04N 5/37455* (2013.01); *H03M 1/462* (2013.01); *H03M 1/468* (2013.01); *H04N 5/378* (2013.01); *H04N 5/37452* (2013.01)

(58) Field of Classification Search
CPC ............... H04N 5/37455; H04N 5/378; H04N 5/37452; H03M 1/462; H03M 1/468
USPC ......................................... 341/155, 156, 172
See application file for complete search history.

(56) References Cited

U.S. PATENT DOCUMENTS

| | | | | |
|---|---|---|---|---|
| 9,041,581 B2 * | 5/2015 | Wolfs | ..................... | H03M 1/185 341/159 |
| 9,712,772 B2 * | 7/2017 | Kim | ........................ | H04N 5/378 |

FOREIGN PATENT DOCUMENTS

| | | |
|---|---|---|
| KR | 10-20150122284 A | 11/2015 |
| KR | 10-1631622 B1 | 6/2016 |
| KR | 10-166078 B1 | 10/2016 |
| KR | 10-1695275 B1 | 1/2017 |

OTHER PUBLICATIONS

Kim, H.J. et al., "A Delta-Readout Scheme for Low-Power CMOS Image Sensors With Multi-Column Parallel SAR ADCs," IEEE Journal of Solid-State Circuits, vol. 51, No. 10, Oct. 2016, 12 pages.

* cited by examiner

*Primary Examiner* — Khai M Nguyen
(74) *Attorney, Agent, or Firm* — Perkins Coie LLP

(57) ABSTRACT

A successive approximation register (SAR) analog-digital converter (ADC) may include a comparison circuit coupled to an array of pixels arranged in rows and columns to receive a first pixel signal and a second pixel signal from a first column and a second column, respectively, and structured to compare each of the first and second pixel signals with a reference voltage and output comparison signals; an analog-digital conversion mode decision circuit located to receive the comparison signals from the comparison circuit and structure to provide a mode decision value which decides an analog-digital conversion mode out of different analog-digital conversion modes based on the comparison signals from the comparison circuit; and a shared circuit shared by the first and second columns, and structured to generate the reference voltage based on the comparison signals from the comparison circuit and the mode decision value from the analog-digital conversion mode decision circuit, the shared circuit outputting the reference voltage to the comparison circuit.

21 Claims, 11 Drawing Sheets

SUCCESSIVE APPROXIMATION REGISTER ANALOG-DIGITAL CONVERTER AND SAR ADC SYSTEM

CROSS-REFERENCE TO RELATED APPLICATION

This patent document claims the priority and benefits of Korean Patent Application No. 10-2017-0161990 filed on Nov. 29, 2017, which is incorporated herein by reference in its entirety.

TECHNICAL FIELD

The technology and implementations disclosed in this patent document relate to a high-speed low-power successive approximation register (SAR) analog-digital converter (ADC) and an SAR ADC system which have a high resolution and small area, and examples of applications in complementary metal oxide semiconductor (CMOS) image sensors.

BACKGROUND

Analog-to-digital conversion converts analog signals into digital signals for digital processing in a digital signal processor or a microprocessor. Different analog-to-digital converter designs offer different performance characteristics including, e.g., the operating speed, the power consumption, the conversion accuracy, the area occupied by the ADC, noise and others.

For example, the high-speed readout, high resolution and low power consumption are important parameters to consider in designing CMOS image sensors, including ADCs used by CMOS image sensors.

There are various types of ADC architectures utilized and studied in CMOS image sensors. For example, a single-slope (SS) ADC using a single-slope ramp as a reference is currently commercialized for use but has difficulties in implementing a high-speed operation and high resolution. In addition, although a variety of techniques have been proposed to achieve low power consumption of the SS ADC, there are many limitations in improving power efficiency in terms of their operation algorithms.

As an alternate technique, a successive approximation register (SAR) ADC can also be used in CMOS image sensors and other circuitry. A SAR ADC implements an internal digital to analog converter (DAC) to produce reference signals and a series of comparisons to determine each bit of the converted result based on an algorithm capable of performing a high-speed operation while consuming low power. Unlike the SS ADC, the SAR ADC generates a reference voltage for performing analog-digital conversion of a pixel signal. Therefore, a reference voltage generator for generating the reference voltage needs to be installed at each column where each SAR ADC is arranged. Since the reference voltage generator has a size, however, the area is inevitably increased due to the presence of the reference voltage generator for the SAR ADC. Therefore, there are difficulties in integrating the SAR ADC in one column while having a size to satisfy a pixel pitch. If reducing the size of the reference voltage generator to fit into one column to satisfy the pixel pitch, such reduction in size has been reported to result in the degradation of the performance of the reference voltage generator and the overall performance of the SAR ADC. Thus, there is limitation to reduce the size of the reference voltage generator, and it difficult to reduce the area for the SAR ADC.

As an alternate technique, a SAR with a capacitor digital-to-analog converter (C-DAC) has been proposed, in which the digital-to-analog converter (DAC) inside the ADC is capacitive. The C-DAC SAR conducts an analog-digital converting of a current pixel signal using an analog-digital conversion result of a previous pixel signal, which can help to improve power efficiency and operation speed. In this case, however, more clocks may be used in comparison to the operation of the existing SAR ADC. Furthermore, the area of the C-DAC is doubled as the resolution bit is increased by one bit. Therefore, a large area may be required to manufacture a high-resolution ADC.

SUMMARY

This patent document provides, among others, designs of an SAR ADC and an SAR ADC system, in which a C-DAC is shared by a plurality of columns.

In an embodiment, a successive approximation register (SAR) analog-digital converter (ADC) may include a comparison circuit coupled to an array of pixels arranged in rows and columns to receive a first pixel signal and a second pixel signal from a first column and a second column, respectively, and structured to compare each of the first and second pixel signals with a reference voltage and output comparison signals; an analog-digital conversion mode decision circuit located to receive the comparison signals from the comparison circuit and structure to provide a mode decision value which decides an analog-digital conversion mode out of different analog-digital conversion modes based on the comparison signals from the comparison circuit; and a shared circuit shared by the first and second columns, and structured to generate the reference voltage based on the comparison signals from the comparison circuit and the mode decision value from the analog-digital conversion mode decision circuit, the shared circuit outputting the reference voltage to the comparison circuit.

In some implementations, wherein the analog-digital conversion mode is either an LSB (Least Significant Bit) analog-digital conversion in which only some of bits of an analog-digital conversion value of a target pixel signal are converted or a full analog-digital conversion in which all bits of the analog-digital conversion value of the target pixel signal are analog-digital converted. In some implementations, the comparison circuit comprises a first comparator located to receive the first pixel signal from the first column and structured to compare the first pixel signal with the reference voltage from the shared circuit, and output a first comparison signal; and a second comparator located to receive the second pixel signal and structured to compare the second pixel signals with the reference voltage from the shared circuit, and output a second comparison signal. In some implementations, the analog-digital conversion mode decision circuit comprises: a first analog-digital conversion mode decider located to receive the first comparison signal from the comparison circuit and structured to decide the analog-digital conversion mode based on the received first comparison signal and a value obtained by comparing most significant bits (MSBs) of an analog-digital conversion value of a previous column pixel signal with a current column pixel signal; and a second analog-digital conversion mode decider located to receive the second comparison signal from the comparison circuit and structured to decide the analog-digital conversion mode based on the received second comparison signal and the value obtained by comparing the MSBs of the analog-digital conversion value of a previous column pixel signal with a current column pixel signal.

In some implementations, the analog-digital conversion mode decision circuit provides the mode decision value based on a comparison between the first pixel signal and a previous column pixel signal prior to the first pixel signal or between the second pixel signal and another previous column pixel signal prior to the second pixel signal. In some implementations, the shared circuit comprises: a shared SAR operation logic circuit located to receive the mode decision value from the analog-digital conversion mode, and configured to output a control signal to conduct the LSB analog-digital conversion or full analog-digital conversion; a shared MSB storage and update circuit receiving the control signal from the shared SAR operation logic circuit and storing MSB information of an analog-digital conversion value of the first pixel signal; a shared ranging circuit receiving the control signal from the shared SAR operation logic circuit and outputting a ranging control value for generating the reference voltage; the shared storage circuit receiving the ranging control value from the shared ranging circuit and outputting an analog-digital conversion value including the MSB information and a LSB information; and a shared capacitor digital-analog converter (C-DAC) receiving the analog-digital conversion value from the shared storage circuit and generating the reference voltage.

In some implementations, the shared SAR operation logic circuit conduct the LSB analog-digital conversion or full analog-digital conversion according to the output values of the comparison circuit and the analog-digital conversion mode decision circuit, wherein the shared MSB storage and update circuit copies the MSB information of the analog-digital conversion value to the shared storage circuit and updates the MSB information according to a comparison result value of the comparison circuit, wherein the shared ranging circuit outputs the value obtained by comparing the MSB information of an analog-digital conversion value of a previous column pixel signal with a current column pixel signal, wherein the shared storage circuit stores the comparison result value of the comparison circuit, and wherein the shared C-DAC outputs the reference voltage to a first comparator and a second comparator of the comparison circuit. In some implementations, the shared storage circuit stores at least one of the MSB information, the LSB information, or the ranging control value. In some implementations, the MSBs information corresponds to a common voltage value for conducting an analog-digital conversion of the first pixel signal. In some implementations, the MSB information corresponds to a pixel signal code value of a previous row that is prior to a current row. In some implementations, the first column and the second column are selected during a same period and a validity of MSBs of a previous signal is checked during the same period. In some implementations, wherein the comparison circuit is coupled to further receive a third pixel signal from a third column and structured to compare the third pixel signal with the reference voltage, and the shared circuit is shared by the third circuit.

In an embodiment, a successive approximation register (SAR) analog-digital converter (ADC) system may include a comparison circuit coupled to an array of pixels arranged in rows and columns to receive a first pixel signal and a second pixel signal from a first column and a second column, respectively, and structured to compare each of the first and second pixel signals with a reference voltage and output comparison signals; an analog-digital conversion mode decision circuit located to receive the comparison signals from the comparison circuit and structure to provide a mode decision value which decides an analog-digital conversion mode out of different analog-digital conversion modes based on the comparison signals from the comparison circuit; a shared circuit shared by the first and second columns, and structured to generate the reference voltage based on the comparison signals from the comparison circuit and the mode decision value from the analog-digital conversion mode decision circuit, the shared circuit outputting the reference voltage to the comparison circuit; and a shared column selection circuit providing a column selection signal to the comparison circuit to enable the first column or the second column, the shared column selection circuit configured to control the analog-digital conversion mode decision circuit and the shared circuit.

In some implementations, the comparison circuit comprises: a first comparator located to receive the first pixel signal and structured to compare the first pixel signal with the reference voltage from the shared circuit, and output a first comparison signal; and a second comparator located to receive the second pixel signal and structured to compare the second pixel signal with the reference voltage from the shared circuit, and outputting a second comparison signal. In some implementations, wherein the analog-digital conversion mode decision circuit comprises: a first analog-digital conversion mode decider located to receive the first comparison signal from the comparison circuit and structured to decide the analog-digital conversion mode based on the received first comparison signal and a value obtained by comparing MSBs of an analog-digital conversion value of the first pixel signal and the second pixel signal; and a second analog-digital conversion mode decider located to receive the second comparison signal from the comparison circuit and structured to decide the analog-digital conversion mode based on the received second comparison signal and the value obtained by comparing the MSBs of the analog-digital conversion value of the first pixel signal and the second pixel signal. In some implementations, the shared circuit comprises: a shared SAR operation logic circuit located to receive the mode decision value from the analog-digital conversion mode, and configured to output a control signal to conduct the LSB analog-digital conversion or full analog-digital conversion operation; a shared MSB storage and update circuit receiving the control signal from the shared SAR operation logic circuit and storing MSB information of an analog-digital conversion value of the first pixel signal; a shared ranging circuit receiving the control signal from the shared SAR operation logic circuit and outputting a ranging control value for generating the reference voltage; the shared storage circuit receiving the ranging control value from the shared ranging circuit and outputting an analog-digital conversion value including the MSB information and a LSB information; and a C-DAC receiving the analog-digital conversion value from the shared storage circuit and generating the reference voltage.

In some implementations, the shared SAR operation logic circuit conduct the LSB analog-digital conversion or full analog-digital conversion according to the output values of the comparison circuit and the analog-digital conversion mode decision circuit, wherein the shared MSB storage and update circuit copies the MSB information of the analog-digital conversion value to the shared storage circuit and updates the MSB information according to a comparison result value of the comparison circuit, wherein the shared ranging circuit outputs the value obtained by comparing the MSB information of an analog-digital conversion value of a previous column pixel signal with a current column pixel signal, wherein the shared storage circuit stores the comparison result value of the comparison circuit, and wherein the shared C-DAC outputs the reference voltage to a first comparator and a second comparator of the comparison circuit. In some implementations, the shared storage circuit stores at least one of the MSB information, the LSB information, or the ranging control value. In some implementations, the MSB information corresponds to a common voltage value for conducting an analog-digital conversion of the first pixel signal. In some implementations, the MSB information corresponds to a pixel signal code value of a previous row that is prior to a current row. In some implementations, the first column and the second column are selected during a same period and a validity of MSBs of a previous signal is checked during the same period.

DETAILED DESCRIPTION

Figure 1:
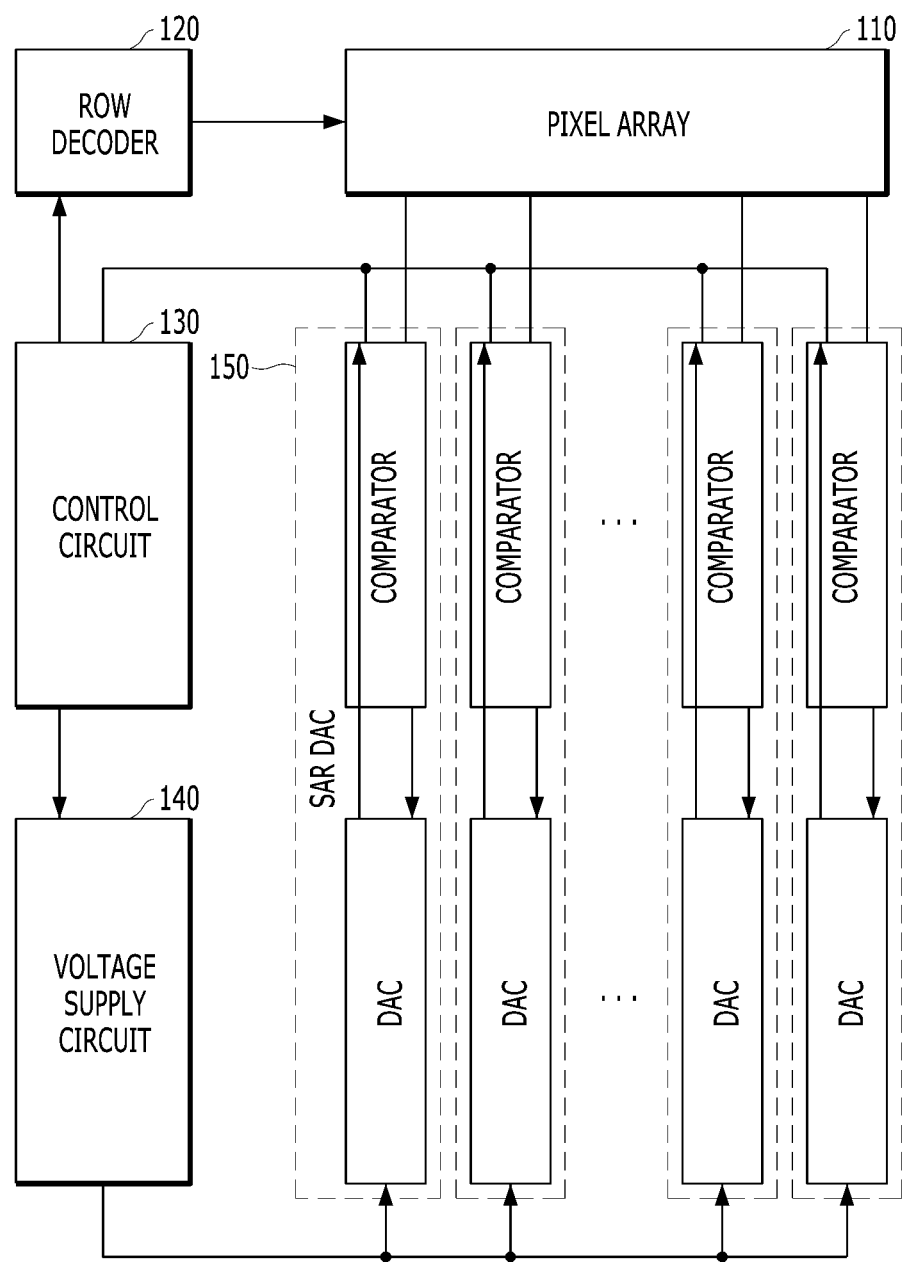
FIG. 1 is a diagram illustrating an example of a CMOS image sensor using a conventional SAR ADC.

FIG. 1 is a diagram illustrating an example of a CMOS image sensor using a general SAR ADC to facilitate understanding of the disclosed technology.

As illustrated in FIG. 1, the CMOS image sensor using general SAR ADCs may include a pixel array 110, a row decoder 120, a voltage supply circuit 140, a plurality of SAR ADCs 150 and a control circuit 130. The pixel array 110 may include imaging pixels arranged in rows and columns and output pixel signals from the pixels in response to incident light at individual imaging pixels. The row decoder 120 may select a pixel within the pixel array 110 for each row line and control an operation of the selected pixel according to a control signal of the control circuit 130. The voltage supply circuit 140 may supply a voltage such as a supply voltage $V_{DD}$, common voltage $V_{CM}$ or ground voltage $V_{SS}$ according to the control signal of the control circuit 130. The plurality of SAR ADCs 150 may be located to receive a pixel signal(s) from the pixel array 10 and perform an analog-digital conversion of the pixel signal from the pixel array 10 using the voltage from the voltage supply circuit 140 according to the control signal of the control circuit 130. The control circuit 130 may be located to communicate with the row decoder 120, the voltage supply circuit 140 and the plurality of SAR ADCs 150 and control the operations of the row decoder 120, the voltage supply circuit 140 and the plurality of SAR ADCs 150.

In some implementations, the SAR ADCs 150 may be provided to be coupled to the respective columns of the pixel array 110 in a column-parallel configuration where imaging pixels in one column share one SAR ADC 150. Each SAR ADC 150 may include a comparator and a digital-analog converter. Referring to FIGS. 2 to 4B, the detailed structure and operations of a SAR ADC 150 will be described. The examples of the SAR ADC as shown in FIGS. 2 to 4B have been suggested and studied in the art and discussed here to promote understanding of the implementations of the disclosed technology.

Figure 2:
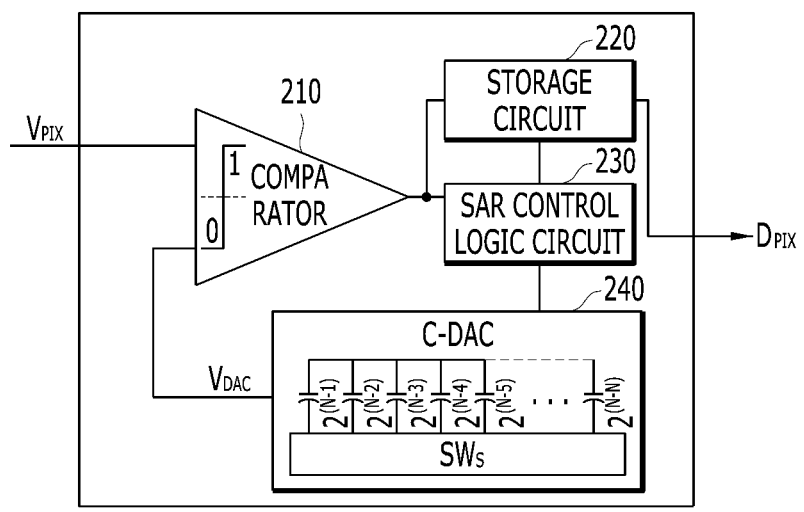
FIG. 2 is a diagram illustrating an example of an SAR ADC for promoting an understanding of the disclosed technology.

FIG. 2 is a diagram illustrating an example of an SAR ADC.

As illustrated in FIG. 2, the SAR ADC may include a comparator 210, a storage circuit 220, an SAR control logic circuit 230 and a capacitor DAC (C-DAC) 240. The comparator 210 may receive a pixel signal $V_{PIX}$ from the pixel array 110 and a reference voltage $V_{DAC}$ from the C-DAC 240. The comparator 210 compare the received signals, i.e., the pixel signal $V_{PIX}$ and the reference voltage $V_{DAC}$ and output a comparison result value. The comparison result value may be transferred from the comparator 210 to the storage circuit 220 and the SAR control logic circuit 230. The storage circuit 220 may store the comparison result value from the comparator 210 and output the comparison result value as an analog-digital conversion value $D_{PIX}$. The SAR control logic circuit 230 may receive the comparison result values from the comparator 210 and the storage circuit 220, and output a control signal according to a predetermined SAR logic. The C-DAC 240 may receive the control signal from the SAR control logic circuit 230, generate a reference voltage according to the control signal from the SAR control logic circuit 230, and output the reference voltage $V_{DAC}$ to the comparator 210.

The configurations and operations of the respective circuits will be described in more detail as follows.

As discussed, the comparator 210 may receive a pixel signal $V_{PIX}$ from a corresponding pixel in the pixel array 110 and receive the reference voltage $V_{DAC}$ from the C-DAC 240. The comparator 210 may compare the pixel signal $V_{PIX}$ with the reference voltage $V_{DAC}$. If the pixel signal $V_{PIX}$ is greater than the reference voltage $V_{DAC}$, the comparator 210 may output a logic high, or 1, as the comparison result value. If the pixel signal $V_{PIX}$ is less than the reference voltage $V_{DAC}$, the comparator 210 may output a logic low, or 0, as the comparison result value. Other implementations are also possible such that the comparator 210 outputs a logic high when the pixel signal $V_{PIX}$ is less than the reference voltage $V_{DAC}$, and the comparator 210 outputs a logic low when the pixel signal $V_{PIX}$ is greater than the reference voltage $V_{DAC}$. Thus, the comparator 210 may output the comparison result value of 0 or 1 to the storage circuit 220 and the SAR control logic circuit 230.

The C-DAC 240 may include a reference voltage generator which is operated according to the control signal from the SAR control logic circuit 230 and generates the reference voltage. The C-DAC 240 may include a binary-weighted capacitor array or thermometer capacitor array and switches SWs. In some implementations, the capacitor array may include capacitors with capacitance values of $C*2^{n-1}$ to $C*2^0$, where n indicates a bit format for analog-digital conversion. Thus, the capacitances in the capacitor array are obtained as a multiple by a power of 2 of the capacitance C.

The SAR ADC may generate the reference voltage by sequentially turning on the switches coupled to the capacitors of the C-DAC 240. The SAR ADC starts by initializing the successive approximation register (SAR) to a value that all bits are set to '0,' except the MSB (Most Significant Bit) which is set to '1'. Thus, the analog-digital conversion is carried out by turning on the capacitors sequentially from the capacitor $C*2^{n-1}$ to the capacitor $C*2^0$ according to the control signal from the SAR control logic circuit 230. The comparator 210 may receive a pixel signal provided from a corresponding pixel in the pixel array 110 and the reference voltages which are sequentially generated from the C-DAC 240, compare the pixel signal to the reference voltages, and output a comparison result value of 0 or 1 to the storage circuit 220 and the SAR control logic circuit 230. Under the control signal from the SAR control logic circuit 230, the reference voltage may be changed up to a binary weighted voltage corresponding to a bit typed variable n used for the analog-digital conversion. Therefore, the C-DAC 240 may output the reference voltage with a reference voltage value close to the value of the pixel signal. The comparison result value of 0 or 1 may be stored in the storage circuit 220, transferred to the switches of the C-DAC 240 through the SAR control logic circuit 230, and then be held or maintained during the next switching operation of the C-DAC 240. Through this operation, the binary weighted voltage value of the reference voltage $V_{DAC}$ may be outputted.

Whenever the reference voltage crosses the voltage of the pixel signal during the operation of comparing the pixel signal to the reference voltage, the comparator 210 may output the comparison result value of 1 or 0. For example, when the reference voltage crosses the voltage of the pixel signal, on/off operations of the switches of the C-DAC 240 may be controlled to decrease or increase the reference voltage, in order to implement the SAR operation. Then, the comparison result value may be inputted and stored in the storage circuit 220, and outputted as the analog-digital conversion value $D_{PIX}$. The storage circuit 220 may include a memory such as a set reset (SR) latch.

The SAR control logic circuit 230 may receive the comparison result value from the comparator 210. The comparison result value may be stored in the storage circuit 220. Based on the received comparison result value from the comparator 210, the SAR control logic circuit 230 may decide whether to turn on or off the switches coupled to the capacitors $C*2^{n-1}$ to $C*2^0$ included in the binary weighted capacitor array of the C-DAC 240.

Thus, the SAR control logic circuit 230 may control the on/off operations of the switches coupled to the capacitors $C*2^{n-1}$ to $C*2^0$ based on the comparison result value from the comparator 210 and the comparison result values of the comparator 210, which are sequentially outputted from the storage circuit 220. Based on the control signal from the SAR control logic circuit 230, the C-DAC 240 can generate the reference voltage corresponding to the binary weighted voltage.

Figure 3A:
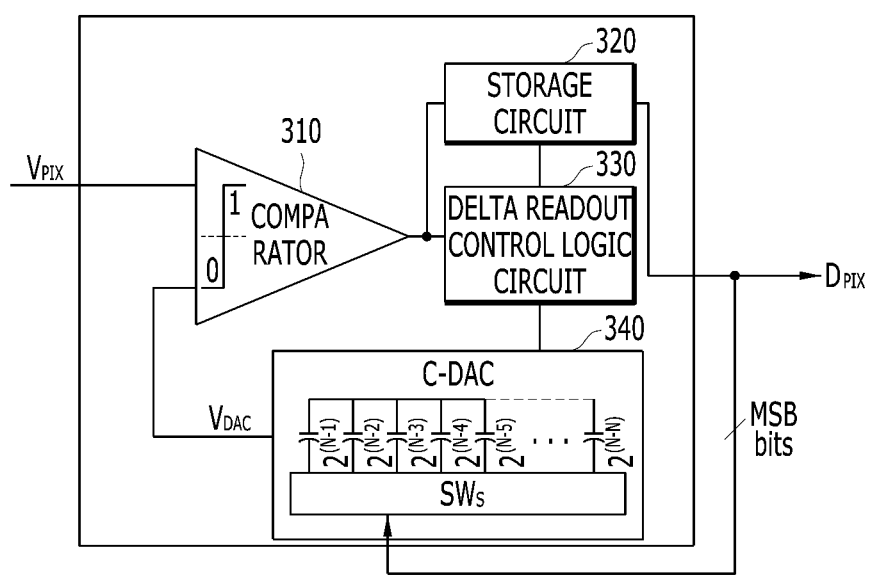
FIG. 3A is a diagram illustrating another example of an SAR ADC for promoting an understanding of the disclosed technology.
Figure 3B:
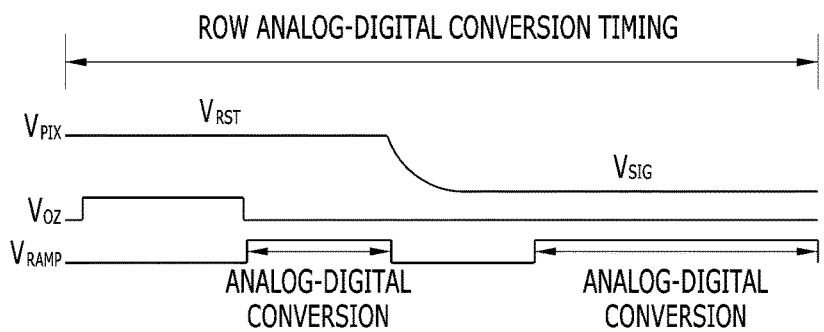
FIG. 3B is a timing diagram of a row analog-digital conversion period in the SAR ADC illustrated in FIG. 3A.

FIG. 3A is a diagram illustrating another example of the SAR ADC, and FIG. 3B is a timing diagram illustrating a row analog-digital conversion period. The example of the SAR ADC and its timing diagram as shown in FIGS. 3A and 3B are provided for promoting understanding of the disclosed technology.

As illustrated in FIG. 3A, the SAR ADC may include a comparator 310, a storage circuit 320, a delta readout control logic circuit 330 and a C-DAC 340. The comparator 310 may receive a pixel signal $V_{PIX}$ from the pixel array 110 and a reference voltage $V_{DAC}$ from the C-DAC 240, compare the pixel signal and the reference signal $V_{DAC}$, and output the comparison result value. The comparison result value may be transferred from the comparator 310 to the storage circuit 320 and the delta readout control logic circuit 330. In this manner, the storage circuit 320 may store the comparison result value received from the comparator 310 for each pixel signal, and output the stored comparison result value as an analog-digital conversion value. In some implementations, the storage circuit 320 may be configured to output the analog-digital conversion value for a previous pixel signal when the comparator 310 receives a current pixel signal that is a subsequent signal received after the previous pixel signal. In this manner, the analog-digital conversion value of the previous pixel signal can be used for the analog-digital conversion of the current pixel signal. The delta readout control logic circuit 330 may receive the comparison result values from the comparator 310 and the storage circuit 220, and output a control signal according to a preset delta readout logic stored in the delta readout control logic circuit 330. The C-DAC 340 may receive the control signal from the delta readout control logic circuit 330, generate a reference voltage according to the control signal from the delta readout control logic circuit 330 and the most significant bits (MSBs) of the analog-digital conversion value outputted from the storage circuit 320, and output the reference voltage to the comparator 310. As compared to the example of FIG. 2, the most significant bits (MSBs) of the analog-digital conversion value outputted from the storage circuit 320 are transferred from the storage circuit 320 to the C-DAC 340.

The SAR ADC illustrated in FIG. 3A may be configured and operated in a similar manner to the SAR ADC of FIG. 2 but different in including a component in order to use an analog-digital conversion value of a previous pixel signal. As shown in FIG. 3A, the delta readout control logic circuit 330 may be implemented by adding logic for using an analog-digital conversion value of a previous pixel signal to the SAR control logic circuit 230 of FIG. 2. In this case, a digital code value corresponding to the MSBs of the analog-digital conversion value for a previous pixel signal, which is outputted from the storage circuit 320, may be inputted to the C-DAC 340, and used for the analog-digital conversion of the current pixel signal.

Using the analog-digital conversion value of the previous pixel signal in the analog-digital conversion of the current pixel signal allows to reduce power consumption required for analog-digital converting the MSBs, when the SAR analog-digital conversion operation is performed. Furthermore, since a settling margin for generating the reference voltage through the capacitors $C*2^{n-1}$ to $C*2^{n-m}$ of the C-DAC 340 of the SAR ADC, corresponding to the MSBs, does not need to be considered during a high-speed operation, the operating speed can be improved to some extent. Here, "m" represents the number of MSBs in the output analog-digital conversion value, which are used for the analog-digital conversion of the next pixel signal.

The improvements in the operation speed, however, become offset by the decrease in the analog-digital conversion speed as discussed below. To implement the SAR ADC using the analog-digital conversion value of the previous pixel signal, the MSBs of the analog-digital conversion value of the previous pixel signal, i.e., MSB information, are provided from the delta readout control logic circuit 330 to the C-DAC 340. During an analog-digital conversion period of a voltage $V_{RAMP}$ illustrated in FIG. 3B, a $V_{RC}$ period in FIG. 4B, which will be further discussed with FIG. 4B later, may require timing for determining the validity of the MSB information. Therefore, the number of clocks is increased in comparison to the operation of the SAR ADC which does not use the analog-digital conversion value of the previous pixel signal in the analog-digital conversion of the current pixel signal, and thus, the analog-digital conversion speed may be reduced.

It is the C-DAC 340 in the SAR ADC which generates the reference voltage for comparing the pixel signal. Due to the absolute area of the C-DAC 340, however, it is difficult to integrate (layout) the SAR ADC in one column to satisfy a size requirement corresponding to the pixel pitch. In order to overcome such a problem, the reference voltage generator which is provided in the SAR ADC needs to be reduced in size such that the SAR ADC can be integrated in one column to satisfy the size corresponding to the pixel pitch. Reducing the size of the reference voltage generator, however, results in a degradation in performance of the reference voltage generator, which also affects to the overall performance of the SAR ADC. Thus, there is some limitation to reduce the size of the reference voltage generator to minimize the performance degradation of the reference voltage generator and the SAR ADC.

Figure 4A:
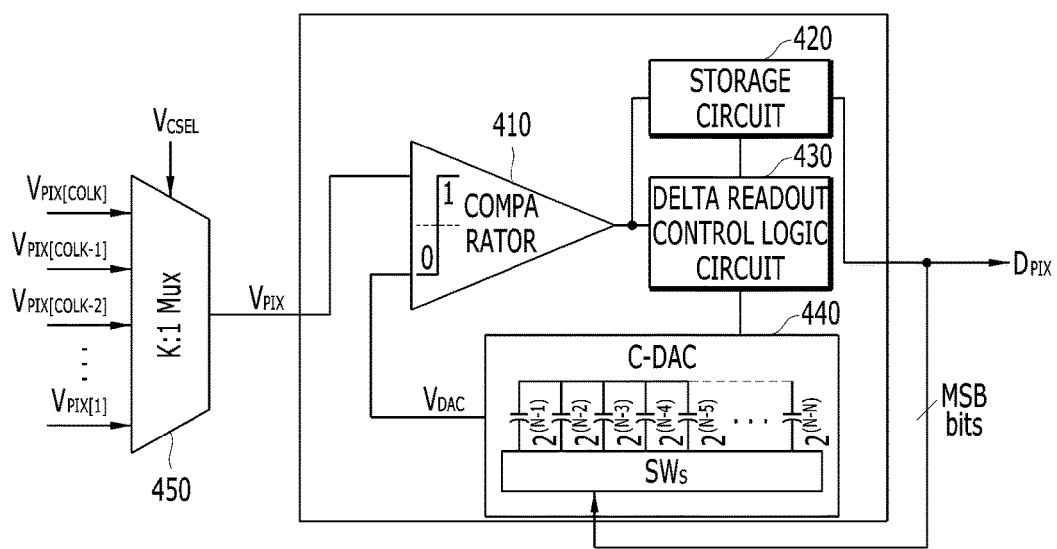
FIG. 4A is a diagram illustrating another example of an SAR ADC for promoting an understanding of the disclosed technology.

For this reason, the SAR ADC having the structure of FIG. 4A has been proposed.

Figure 4B:
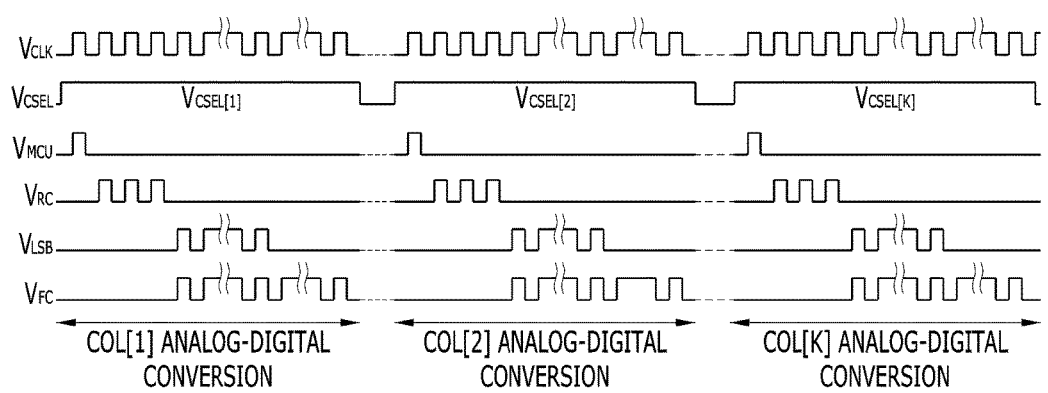
FIG. 4B is a timing diagram illustrating the SAR ADC illustrated in FIG. 4A.

FIG. 4A is a diagram illustrating an example of a SAR ADC based on the disclosed technology, and FIG. 4B is an exemplary timing diagram of the SAR ADC illustrated in FIG. 4A.

As illustrated in FIG. 4A, the SAR ADC may include a multiplexer (MUX) 450, a comparator 410, a storage circuit 420, a delta readout control logic circuit 430 and a C-DAC 440. The MUX 450 may be connected to the input of the comparator 410 and sequentially select pixel signals according to a select control signal $V_{CSEL}$ (refer to FIG. 4B) received from an external controller (not illustrated), for example, a timing generator. Unlike examples as shown in FIGS. 2 to 3B, the example of FIG. 4A includes the MUX 450 to sequentially provide the pixel signal based on the select control signal $V_{CSEL}$. The comparator 410 may receive the pixel signal $V_{PIX}$ selected through the MUX 450 and a reference voltage $V_{DAC}$ from the C-DAC 440, compare the received pixel signal $V_{PIX}$ and the received reference voltage $V_{DAC}$, and output a comparison result value. The comparison result value may be transferred from the comparator 410 to the storage circuit 420 and the delta readout control logic circuit 430. The storage circuit 420 may store the comparison result value from the comparator 410, and output the comparison result value as an analog-digital conversion value. The delta readout control logic circuit 430 may receive the comparison result values from the comparator 410 and the storage circuit 420, and output a control signal according to a preset delta readout logic stored in the delta readout control logic circuit 430. The C-DAC 440 may receive the control signal from the delta readout control logic circuit 430, generate the reference voltage according to the control signal from the delta readout control logic circuit 430 and the MSBs of the analog-digital conversion value outputted from the storage circuit 420, and output the reference voltage to the comparator 410.

The SAR ADC illustrated in FIG. 4A may be configured and operated in a similar manner to the SAR ADC of FIG. 3A but different from the SAR ADC of FIG. 3A in that the SAR ADC of FIG. 4A includes a component for sequentially selecting the pixel signals.

As mentioned above, the SAR ADC of FIG. 4A is not installed for each column and rather provided in an area corresponding to a plurality of columns. In this case, the plurality of columns that share a single SAR ADC can be used as a pitch. Therefore, the SAR analog-digital conversion can be performed while maintaining the performance quality of the SAR ADC. The configuration of the SAR ADC of FIG. 4A enables to avoid a precision reduction caused by the mismatching in the capacitor array, which occurs when the C-DAC 440 is integrated to fit in one column to satisfy a size corresponding to a narrow pixel pitch.

When the SAR ADC occupies an area corresponding to the plurality of columns, as illustrated in FIG. 4A, the MUX 450 may sequentially provide a plurality of pixel signals from the corresponding columns of the pixel array for their analog-digital conversions. The MUX 450 may include switches for sequentially selecting the pixel signals of the respective columns. During the operations of the switches, for example, selection of the switches and turning on or off of the switches, however, some undesired results including charge injection, clock feedthrough and coupling may occur, which causes non-linearity of the pixel signals. In this case, the image quality of the image sensor may be degraded.

Figure 5A:
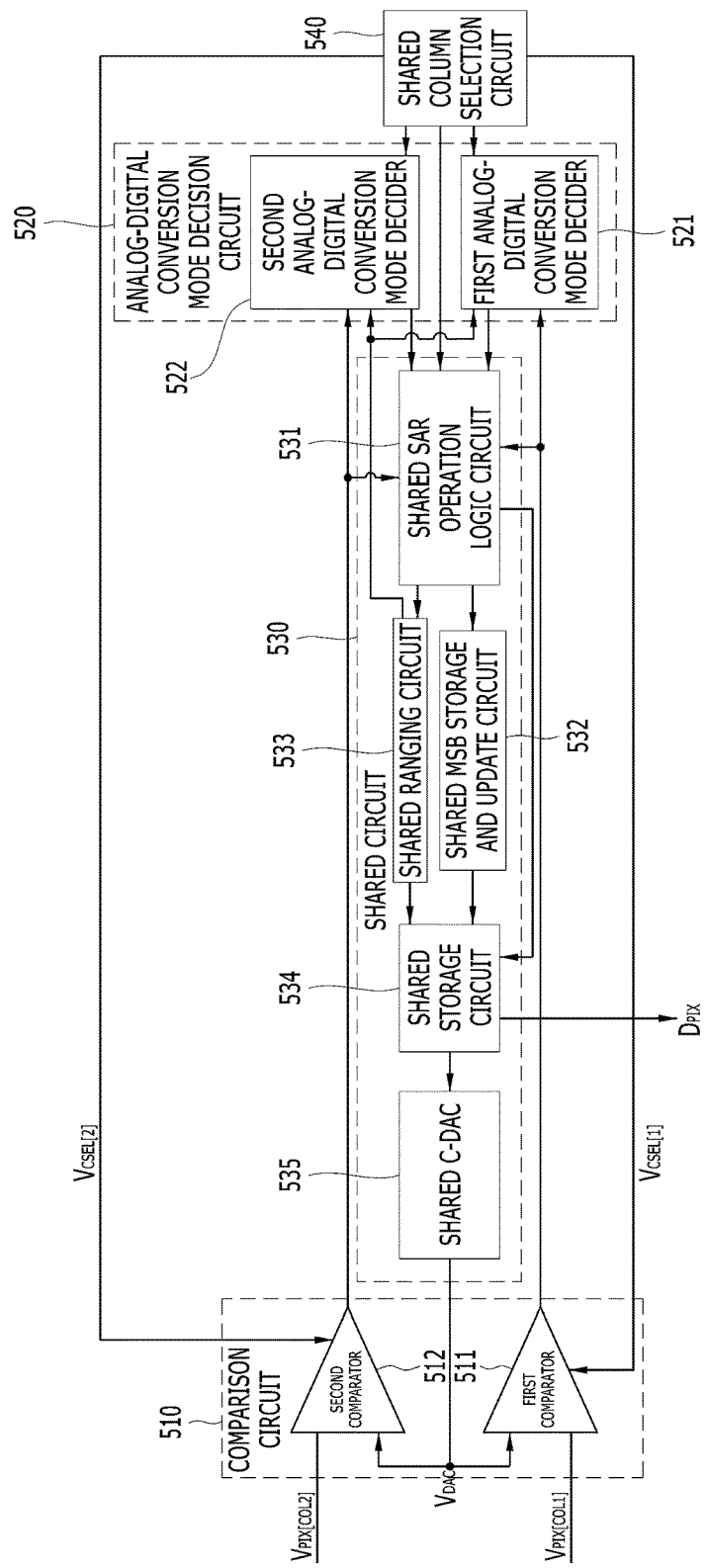
FIG. 5A is an exemplary schematic diagram illustrating an SAR ADC and an SAR ADC system in accordance with an embodiment of the disclosed technology.
Figure 5B:
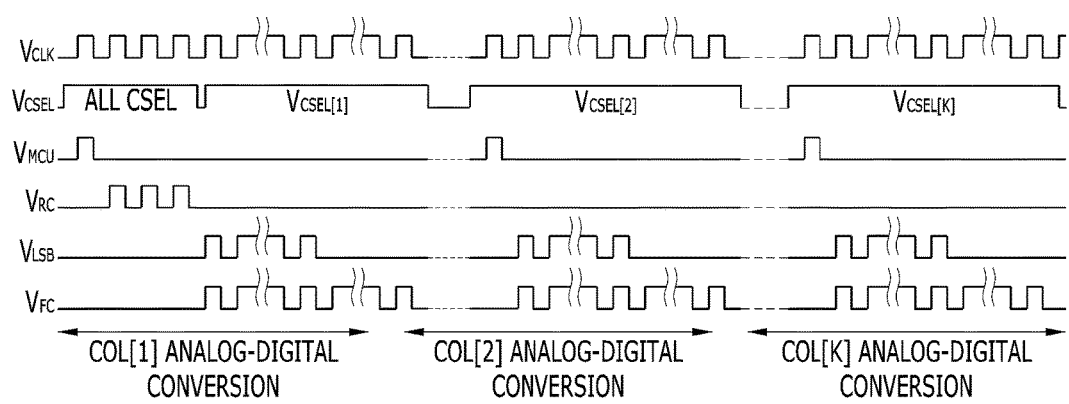
FIG. 5B is an example of a timing diagram of an SAR ADC and an SAR ADC system based on the disclosed technology.
Figure 5C:
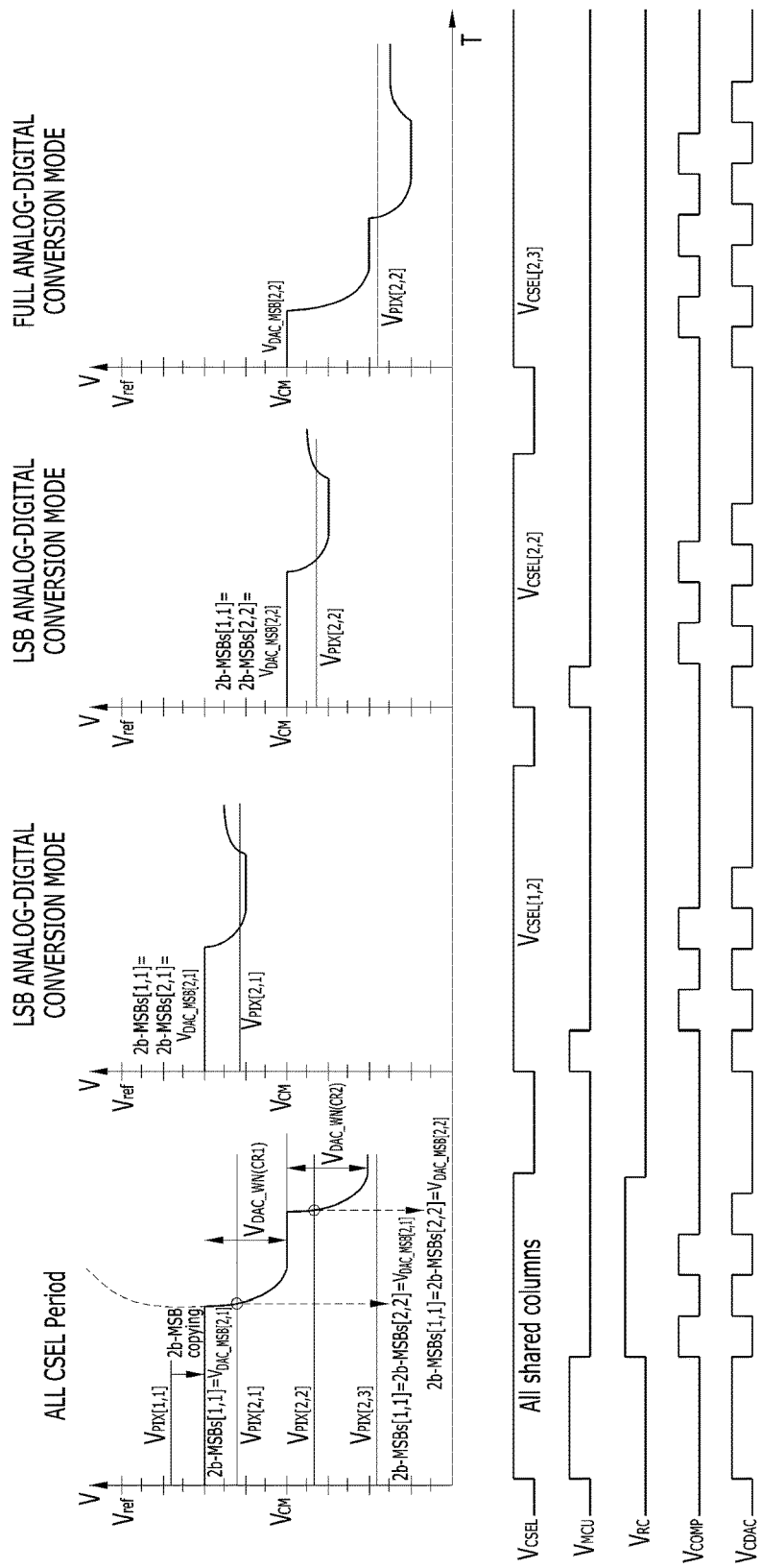
FIG. 5C illustrates exemplary operation waveforms of an SAR ADC and an SAR ADC system based on the disclosed technology.

Implementations of the disclosed technology provide designs for a SAR ADC that can solve the problems caused by the MUX. FIG. 5A is a diagram illustrating an SAR ADC and an SAR ADC system in accordance with an embodiment of the disclosed technology, FIG. 5B is an exemplary timing diagram of the SAR ADC and the SAR ADC system illustrated in FIG. 5A, and FIG. 5C illustrates exemplary operation waveforms of the SAR ADC and the SAR ADC system illustrated in FIG. 5A.

As illustrated in FIG. 5A, the SAR ADC in accordance with the present embodiment may include a comparison circuit 510, an analog-digital conversion mode decision circuit 520 and a shared circuit 530. The comparison circuit 510 may include first and second comparators 511 and 512 to receive pixel signals from the respective columns, compare the received pixel signals with a reference voltage, and output comparison signals (comparison result values). The analog-digital conversion mode decision circuit 520 may receive the comparison signals outputted from the comparison circuit 510 and decide an analog-digital conversion mode between a LSB analog-digital conversion and a full analog-digital conversion (which will be explained later in detail) based on the received comparison signals. The shared circuit 530 may be shared by a plurality of columns, generate the reference voltage for the LSB analog-digital conversion or the full analog-digital conversion according to the comparison signals from the comparison circuit 510 and the mode decision value from the analog-digital conversion mode decision circuit 520, and output the reference voltage to the comparison circuit 510. The configuration and operation of each of the comparison circuit 510, the analog-digital conversion mode decision circuit 520 and the shared circuit 530 may be further discussed in detail.

The SAR ADC system in accordance with the present embodiment may further include a shared column selection circuit 540 in addition to the elements of the SAR ADC, i.e., the comparison circuit 510, the analog-digital conversion mode decision circuit 520, the shared circuit 530 and a shared column selection circuit 540. The comparison circuit 510 may compare a reference voltage to a plurality of pixel signals, and output comparison signals (comparison result values). The analog-digital conversion mode decision circuit 520 may decide an analog-digital conversion mode using the comparison signals from the comparison circuit 510. The shared circuit 530 may be shared by a plurality of columns, generate the reference voltage for LSB analog-digital conversion or full analog-digital conversion according to the comparison signals from the comparison circuit 510 and the mode decision value from the analog-digital conversion mode decision circuit 520, and output the reference voltage to the comparison circuit 510. The shared column selection circuit 540 may enable a column of the comparison circuit 510, and control the analog-digital conversion mode decision circuit 520 and the shared circuit 530 to perform an analog-digital conversion operation of the enabled column.

The comparison circuit 510 may include first and second comparators 511 and 512 which are connected to receive pixel signals from a first column and a second column of the pixel array (not shown), respectively. Each of the first and second comparators 511 and 512 of the comparison circuit 510 may be connected to receive the reference voltage from the shard circuit 530. The first comparator 511 may compare the pixel signal of the first column with the reference voltage from the shared circuit 530 and output a first comparison signal, and the second comparator 512 may compare the pixel signal of the second column to the reference voltage from the shared circuit 530 and output a second comparison signal.

The analog-digital conversion mode decision circuit 520 may include first and second analog-digital conversion mode deciders 521 and 522. The first analog-digital conversion mode decider 521 may decide the analog-digital conversion mode between the LSB analog-digital conversion and the full analog-digital conversion based on the first comparison signal provided from the comparison circuit 510 and a value obtained by comparing the MSBs of an analog-digital conversion value of a previous column pixel signal with a current column pixel signal. The MSBs of the analog-digital conversion value of the previous column pixel signal may be provided from the shared circuit 530. The previous column pixel signal is the signal which was provided to the first comparator 511 prior to the current column pixel signal. The second analog-digital conversion mode decider 522 may decide the analog-digital conversion mode between the LSB analog-digital conversion and the full analog-digital conversion based on the second comparison signal provided from the comparison circuit 510 and the value obtained by comparing the MSBs of the analog-digital conversion value of a previous column pixel signal with a current column pixel signal. The MSBs of the analog-digital conversion value of the previous column pixel signal may be provided from the shared circuit 530. The previous column pixel signal is the signal which was provided to the second comparator 512 prior to the current column pixel signal.

The shared circuit 530 may include a shared SAR operation logic circuit 531, a shared MSB storage and update circuit 532, a shared ranging circuit 533, a shared storage circuit 534 and a shared C-DAC 535. The shared SAR operation logic circuit 531 may be shared by the plurality of columns, and control an LSB analog-digital conversion or full analog-digital conversion based on the output values of the comparison circuit 510 and the analog-digital conversion mode decision circuit 520. The shared MSB storage and update circuit 532 may be shared by the plurality of columns, store the MSBs of the analog-digital conversion value of the previous column pixel signal, provide by, for example, copying the MSBs of the analog-digital conversion value to the shared storage circuit 534, and update the MSBs according to the comparison result value of the comparison circuit 510. The shared MSB storage and update circuit 532 may operate based on the control from the shared SAR operation logic circuit 531. The shared ranging circuit 533 may be shared by the plurality of columns, output a value obtained by comparing the MSBs of the analog-digital conversion value of the previous column pixel signal to the current column pixel signal to the analog-digital conversion mode decision circuit 520 according to control of the shared SAR operation logic circuit 531, and output a ranging control value for generating a reference voltage $V_{DAC\_WN}$ for the comparison operation to the shared storage circuit 534. The shared storage circuit 534 may be shared by the plurality of columns, store the comparison result value of the comparison circuit 510 obtained from the shared MSB storage and update circuit 532, output the comparison result value as analog-digital conversion value, and store the ranging control value obtained from the shared ranging circuit 533. The shared C-DAC 535 may be shared by the plurality of columns, generate the reference voltage based on the value stored in the shared storage circuit 534, and output the reference voltage to the comparators of the comparison circuit 510.

The configurations and operations of the respective circuits will be described in more detail as follows.

The first comparator 511 installed in or connected to the first column may receive the pixel signal $V_{PIX[COL1]}$ from the first column and the reference voltage $V_{DAC}$ generated by the shared C-DAC 535, compare the pixel signal $V_{PIX[COL1]}$ and the reference voltage $V_{DAC}$, and output the first comparison signal to the shared SAR operation logic circuit 531 and the first analog-digital conversion mode decider 521. The second comparator 512 installed in or connected to the second column may receive the pixel signal $V_{PIX[COL2]}$ from the second column and the reference voltage $V_{DAC}$ generated by the shared C-DAC 535, compare the pixel signal $V_{PIX[COL2]}$ and the reference voltage $V_{DAC}$, and output the second comparison signal to the shared SAR operation logic circuit 531 and the second analog-digital conversion mode decider 522. The implementation of the disclosed technology provides a design for a SAR ADC with the shared circuit 530 which includes the shared SAR operation logic circuit 531, the shared MSB storage and update circuit 532, the shared ranging circuit 533, and the shared storage circuit 534, and the shared C-DAC 535. Thus, it is possible to reduce the area for the SAR-ADC by having the shared circuit 530 to allow the multiple columns (for example, two in the example as shown FIG. 5a) to share the C-DAC. The C-DAC has been known to occupy a large area, especially when the C-DAC is arranged for each column. In addition, in the example of the disclosed technology, the pixel signals of the respective columns are not selectively received through the MUX as done in FIG. 4A in which the pixel signals are selectively received by one comparator 410 through the MUX 450. Thus, it is possible to avoid a non-linearity problem which may be caused by the operations of the switches in the MUX 450. Although the example shown in FIG. 5a shows that the SAR-ADC is designed to be shared by the two columns, the number of columns sharing the SAR-ADC may be changed, for example, to three or four, depending on the structure and shape of the CMOS image sensor.

The first and second analog-digital conversion mode deciders 521 and 522 may decide a particular analog-digital conversion mode between the LSB analog-digital conversion and the full analog-digital conversion based on a validity of the MSB information as discussed in detail later. The LSB analog-digital conversion proceeds to conduct the analog-digital conversion of the pixel signal of the current column using the MSBs of the analog-digital conversion value of the previous column pixel signal. The full-analog-digital conversion proceeds to reset a voltage value of the MSBs, $V_{DAC\_MSB}$, and conduct the analog-digital conversion for every bit of the analog-digital conversion value without using the MSBs of the analog-digital conversion value of the previous column pixel signal. The operation based on the mode decided by the first and second analog-digital conversion mode deciders 521 and 522, i.e., the LSB analog-digital conversion and the full analog-digital conversion, may be implemented by the shared SAR operation logic circuit 531.

Figure 6A:
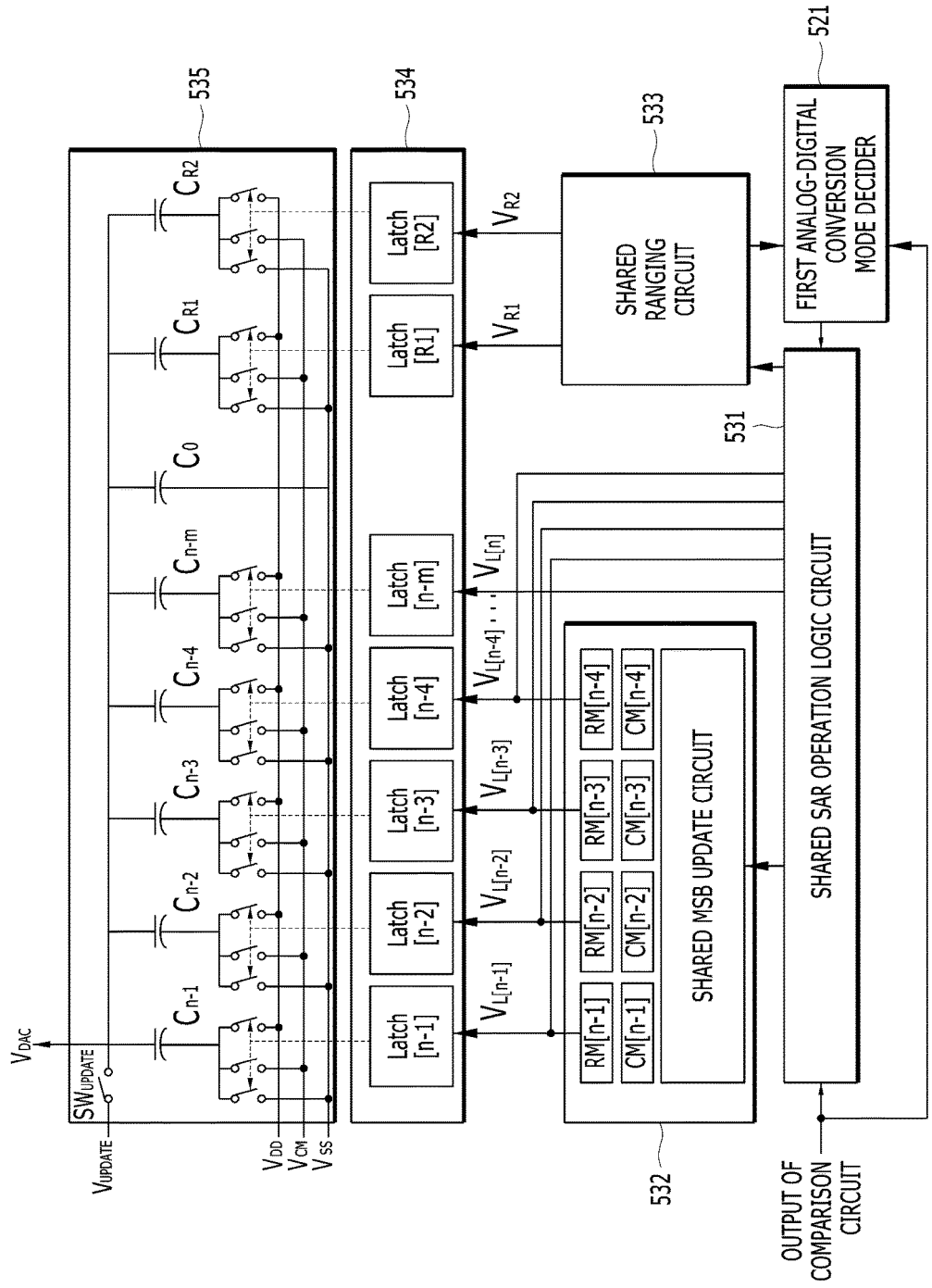
FIG. 6A is an exemplary configuration diagram of a shared circuit of FIG. 5A based on the disclosed technology.
Figure 6B:
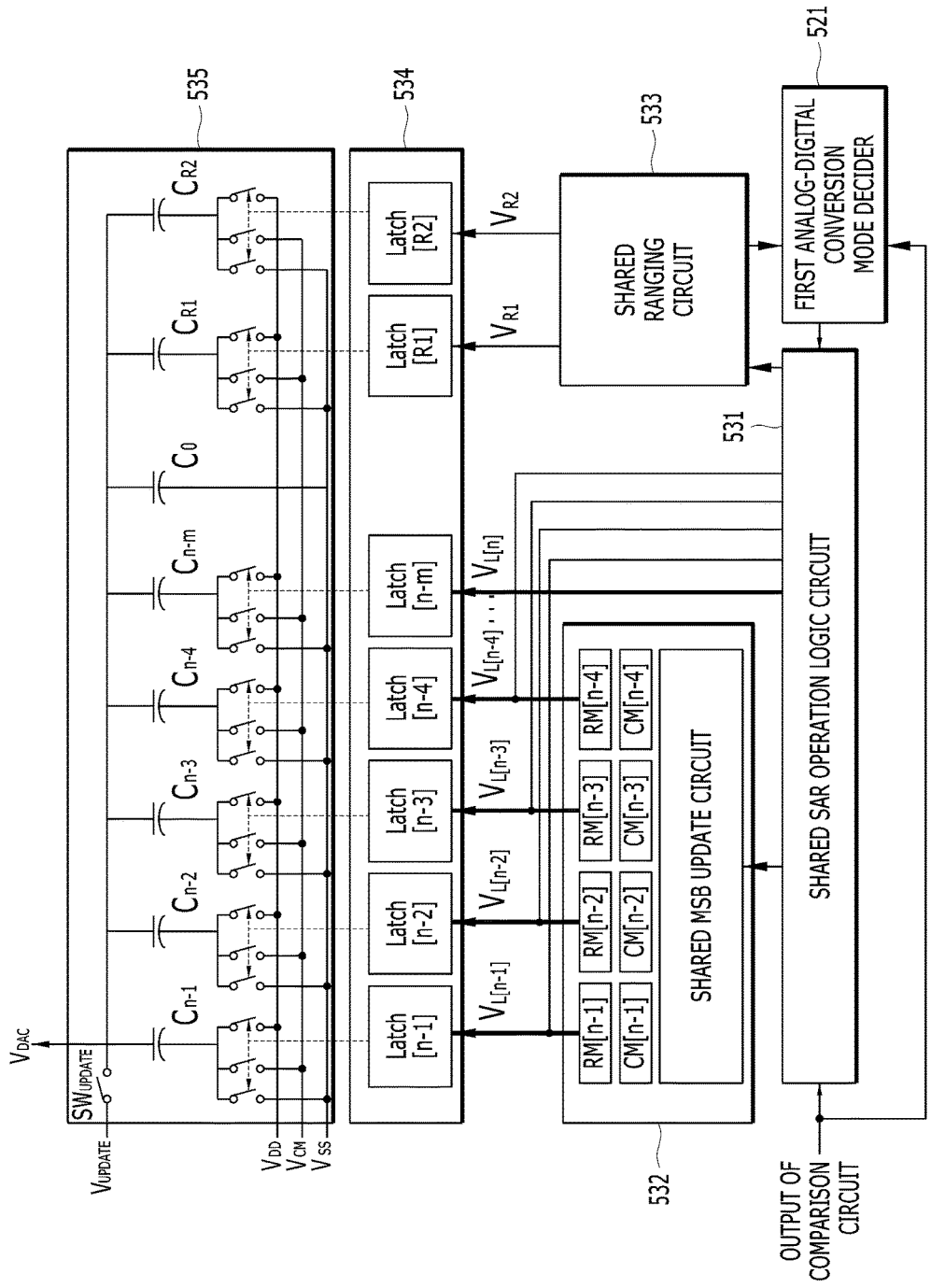
FIG. 6B illustrates an example of an LSB analog-digital conversion operation of a shared circuit based on the disclosed technology.
Figure 6C:
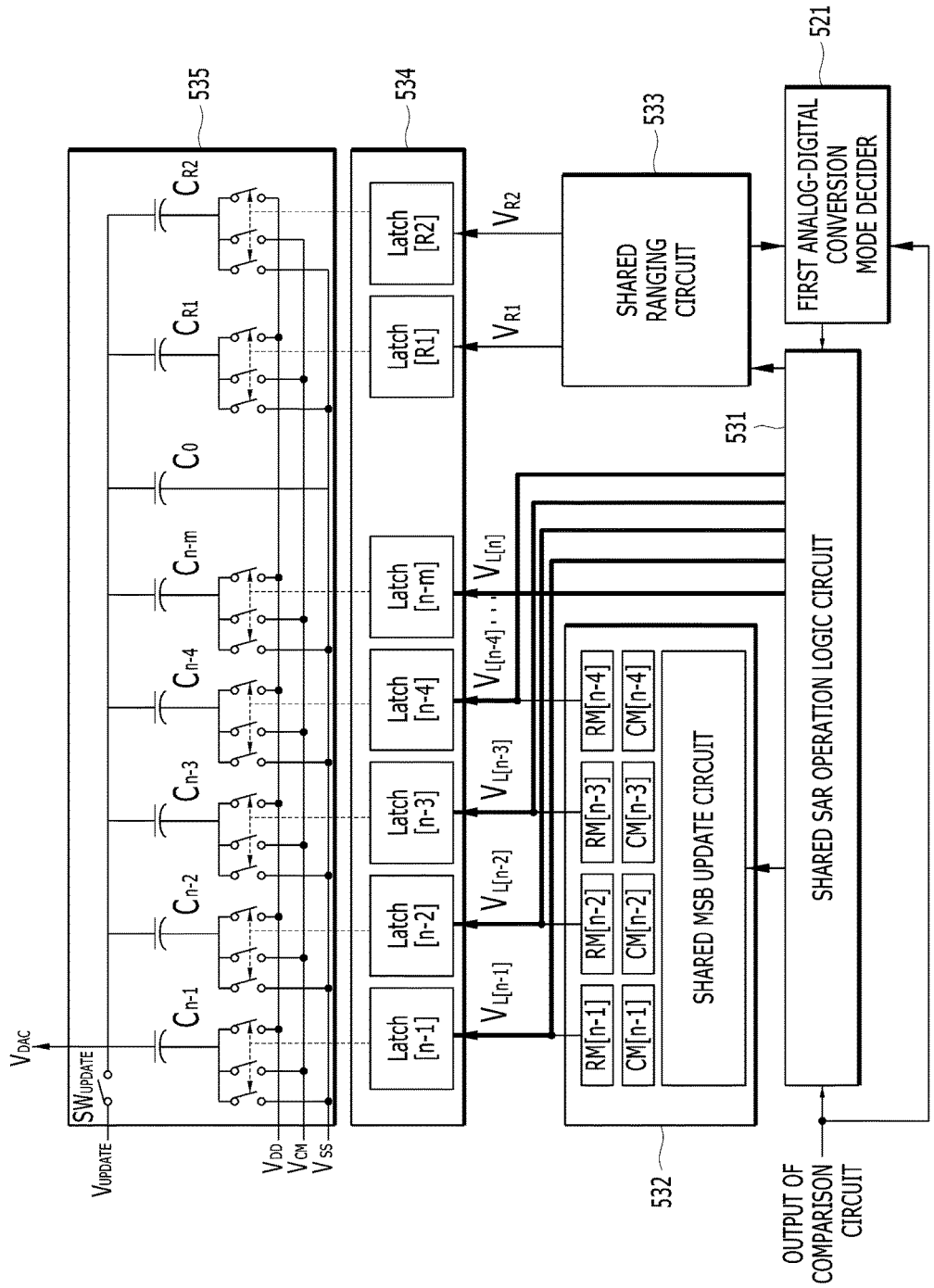
FIG. 6C illustrates an example of a full analog-digital conversion operation of a shared circuit based on the disclosed technology.

Each of the first and second analog-digital conversion mode deciders 521 and 522 may store, for a corresponding column, a difference between the value of the current column pixel signal and the MSBs of the analog-digital conversion value of the previous column pixel signal, and the operation mode may be decided as either the LSB analog-digital conversion or the full analog-digital conversion through a calculation. Assume that the C-DAC 535 includes capacitors $C_{R1}$ to $C_{R2}$ that are used to generate the reference voltage (see FIGS. 6a and 6b). If the output value of the comparison circuit 510 is changed when the capacitor $C_{R2}$ is raised at a certain column, the first and second analog-digital conversion mode deciders 521 and 522 may decide the operation mode such that the shared MSB storage and update circuit 532 updates the MSBs of the analog-digital conversion value of the previous column pixel signal by adding +1 to the MSBs through the shared SAR operation logic circuit 531, and performing analog-digital conversion on only the remaining LSBs. The number of capacitors included in the C-DAC 535 to generate the reference voltage is not limited to the two and can be changed. In some implementations, if the output value of the comparison circuit 510 is changed when the z-th capacitor $C_{Rz}$ is raised, the MSBs copied from the analog-digital conversion value of the previous column pixel signal may be updated by adding +(z−1) to the MSBs, and performing LSB analog-digital conversion on the remaining LSBs. Here, z represents the number of raising operations. When the output value of the comparison circuit 510 is not changed up to the operation of the capacitor $C_{Rz}$, the analog-digital conversion is performed from the MSBs to the LSBs, without using the MSBs copied from the analog-digital conversion value of the previous column pixel signal. When the output value of the comparison circuit 510 is changed during the process of controlling the capacitor $C_{Rz}$ in the shared C-DAC 535, the LSB analog-digital conversion mode may be performed as illustrated in FIG. 6B. Otherwise, when the output value of the comparison circuit 510 is not changed during the process of controlling the capacitor $C_{Rz}$ in the shared C-DAC 535, the full analog-digital conversion mode may be performed as illustrated in FIG. 6C.

The shared SAR operation logic circuit 531 may receive the comparison signals from the comparison circuit 510, and control the operation based on the LSB analog-digital conversion mode or the full analog-digital conversion mode according to the mode decision value from the analog-digital conversion mode decision circuit 520.

The shared MSB storage and update circuit 532 may output a voltage value $V_{DAC\_MSB}$ to the shared C-DAC 535 through the shared storage circuit 534, in order to analog-digital convert the current column pixel signal using the MSBs of the analog-digital conversion value of the previous column pixel signal. When $V_{PIX[COL2]}$ represents a pixel signal of a current column selected for analog-digital conversion in FIG. 5A, the analog-digital conversion value of the pixel signal $V_{PIX[COL1]}$ may correspond to the analog-digital conversion value of the previous column pixel signal. The voltage value $V_{DAC\_MSB}$ corresponds to the number of MSBs, for example, 'x' when 'x' represents the number of MSBs selected from the analog-digital conversion value of the previous column pixel signal. Furthermore, the MSBs of the analog-digital conversion value of the previous column pixel signal may be needed to be updated, in order to use the MSBs to analog-digital convert the value of the current column pixel signal. The need for update may be decided in the $V_{RC}$ period of FIG. 5C, in which the validity of the MSBs of the analog-digital conversion value of the previous column pixel signal is determined after the MSBs of the analog-digital conversion value of the previous column pixel signal are copied and compared to the value of the current column pixel signal. In some implementations, when the copied MSBs are '0011' as 4 bit MSBs, the 4 bit MSBs may be updated to a value by adding 1 or 2, which is '0011+0001' or '0011+0010.'

The shared ranging circuit 533 may copy the MSBs of the analog-digital conversion value of the previous column pixel signal, compare the copied MSBs to the value of the current column pixel signal, and output a comparison result value to the analog-digital conversion mode decision circuit 520. Furthermore, the shared ranging circuit 533 may store, in the shared storage circuit 534, the ranging control value for generating the reference voltage $V_{DAC\_WN}$ for the comparison operation, such that the capacitors $C_{R1}$ and $C_{R2}$ of the shared C-DAC 535 of FIGS. 6A to 6C are controlled according to the ranging control value, thereby generating the reference voltage $V_{DAC\_WN}$ for the corresponding comparison operation.

The shared storage circuit 534 may store the comparison result value of the comparison circuit 510 and output the comparison result value as the analog-digital conversion value, and the binary capacitor array of the shared C-DAC 535 for generating the reference voltage for analog-digital conversion may be controlled according to the values stored in the shared storage circuit 534 (for example, the MSBs, the LSBs and the ranging control value).

The shared C-DAC 535 may generate the reference voltage required for the analog-digital conversion of a pixel signal according to the values stored in the shared storage circuit 534, and include the binary capacitor array. As illustrated in FIG. 6A, the shared C-DAC 535 may include capacitors $C_{n-1}$ to $C_0$, the capacitors $C_{R1}$ and $C_{R2}$ and one switch $SW_{UPDATE}$. When the switch $SW_{UPDATE}$ is turned on, an update voltage may be applied to the capacitors to reset the charges.

The shared column selection circuit 540 may be connected to the comparison circuit 510 and provide select control signals $V_{CSEL[1]}$ and $V_{CSEL[2]}$ to the comparators 511 and 512 in the comparison circuit 510, respectively. The shared column selection circuit 540 may enable the comparator of each column to perform analog-digital conversion, according to the select control signal $V_{CSEL}$, and control the analog-digital conversion mode decision circuit 520 and the shared circuit 530 to perform an analog-digital conversion operation of the corresponding comparator. Since the input terminals of the plurality of comparators hold the values of the pixel signals of the respective columns, the operation of enabling the comparator with the select control signal $V_{CSEL[1]}$ or $V_{CSEL[2]}$ may have the same effect as the operation of enabling the voltage value of the pixel signal of the corresponding column.

Next, the timings as shown in FIG. 5B in accordance with the present embodiment will be discussed in comparison with the timings for utilizing the MSB information of the previous column pixel signal as shown in FIG. 4B. FIGS. 5B and 4B illustrate timings of signals, $V_{CLK}$, $V_{CSEL}$, $V_{MCU}$, $V_{RC}$, $V_{SLB}$ and $V_{FC}$. In FIG. 5B and 4B, $V_{CLK}$ represents the master clock of the system. $V_{CSEL}$ represents a control signal for selecting a specific column among a plurality of columns, when one ADC is used to conduct the analog-digital converting of pixel signals of the plurality of columns. Through the selection operation, the plurality of columns may be sequentially selected from one column to 'n' columns, when there exist total 'n' number of columns in the pixel array. Furthermore, $V_{MCU}$ represents timing at which the MSBs of the analog-digital conversion value of the previous column pixel signal are updated so as to be used for analog-digital converting the currently selected pixel signal. At this time, the shared C-DAC 535 may generate a value corresponding to the MSBs of the analog-digital conversion value of the previous column pixel signal as the reference voltage. Furthermore, $V_{RC}$ represents timing at which the validity of the MSBs of the analog-digital conversion value of the previous column pixel signal is checked when the MSBs are used. For example, when the current column pixel signal has a higher value than the voltage value $V_{DAC\_MSB}$ corresponding to the MSB information of the previous column pixel signal, the comparator may output a value of 1. When $V_{DAC\_WN}$ ($C_{Rn}$) is added to the reference voltage during a predetermined operation period of the capacitor $C_{Rn}$ such that a relation of $V_{PIX} - V_{DAC\_MSB} - V_{DAC\_WN}(C_{Rn}) < 0$ is satisfied, the output value of the comparator becomes 0, and thus, the LSB analog-digital conversion mode may be performed. On the other hand, when the current column pixel signal has a lower value than $V_{DAC\_MSB}$ corresponding to the MSB information of the previous column pixel signal, the comparator may output a value of 0. At this time, when $V_{DAC\_WN}$ ($C_{Rn}$) is added to the reference voltage during the operation period of the capacitor $C_{Rn}$ such that a relation of $V_{PIX} - V_{DAC\_MSB} - V_{DAC\_WN}(C_{Rn}) > 0$ is satisfied, the output value of the comparator becomes 1, and thus, the full analog-digital conversion mode may be performed. FIG. 4B shows that the number of clocks is increased in the timing $V_{RC}$ during the analog-digital conversion (when $V_{CSEL}$ is on) of each column. However, FIG. 5B shows that the timing $V_{RC}$ is turned on in a period ALL CSEL where all columns are selected, and thus, the number of clocks is reduced in comparison to FIG. 4B. In FIG. 4B, the clocks may be required in the timing $V_{RC}$ for each column. In FIG. 5B, however, the clocks may be needed in the timing $V_{ALL\_CSEL}$ for all of the columns which share the shared circuit 530 as illustrated in FIG. 5A and thus, the number of clocks can be reduced by a scale factor of 1/at, when "a" represents the number of comparators or columns which share the shared circuit 530 as illustrated in FIG. 5A. The result value in the $V_{RC}$ period may be stored in the analog-digital conversion mode decision circuit 520 and utilized in the period $V_{MCU}$. Furthermore, the result value in the $V_{RC}$ period may be utilized when the analog-digital conversion mode decision circuit 520 decides the analog-digital conversion mode after the shared column selection circuit 540 selects the comparators of the respective columns.

Referring to FIG. 5C, operations of a 4-bit SAR ADC will be described as follows. In the description of the operations as shown in FIG. 5C, it is assumed that two bits are provided from the analog-digital conversion value of the previous column pixel signal. In some implementations, the MSBs which are used for the analog-digital conversion of a pixel signal from a first column may be determined to have values corresponding to the value of the common voltage $V_{CM}$ of full reference, or a pixel signal code value of the previous row. The full reference indicates a reference voltage having a range between a maximum value to a minimum value of the reference voltage. For this operation, the MSB information of the first column among the sharing columns may be stored in RM[n] of the shared MSB storage and update circuit 532 illustrated in FIGS. 6A to 6C, and the MSB information of the column next to the first column may be stored in CM[n] of the shared MSB storage and update circuit 532 illustrated in FIGS. 6A to 6C. The analog-digital conversion mode decision circuit 520 may update, for each column, the MSB information based on the information generated during the timing period $V_{RC}$. FIG. 5C illustrates that a 2-MSB value of the first column $V_{PIX[1,1]}$ among the sharing columns of the previous row is used, and the 2-MSB values of the columns $V_{PIX[2,1]}$, $V_{PIX[2,2]}$ and $V_{PIX[2,3]}$ of the current row are subject to the analog-digital conversion using the 2-MSB value of the first column $V_{PIX[1,1]}$. Here, the numbers in the brackets may indicate [row, column]. Furthermore, during the $V_{RC}$ period, the capacitors $C_{R1}$ and $C_{R2}$ may be used. In some implementations, the size of the capacitor $C_R$ may be decided according to the 1 MSB step, i.e. the sum of the remaining LSBs. During the first 1-row operation, the periods $V_{MCU}$ and $V_{RC}$ may be conducted in the period ALL SCELL. In the period $V_{MCU}$, the 2-MSB bit information may be copied from the first column $V_{PIX[1,1]}$. Thus, the 2-MSB bit information may be transferred to the shared C-DAC 535 from RM[n] of the shared storage circuit 534 in FIGS. 6A to 6C, in order to generate the voltage value $V_{DAC\_MSB}$ corresponding to the 2-MSB bit information. Then, in the $V_{RC}$ period, the capacitors $C_R$ may be sequentially controlled to generate the reference voltage $V_{DAC\_WN}$ through the shared C-DAC 535, in order to determine the validity of the information $V_{DAC\_MSB}$. The information on the operation mode and the update of the MSB information may be stored in the first and second analog-digital conversion mode deciders 521 and 522 of each column. Here, $V_{COMP}$ represents operation timing of the comparator, and $V_{CDAC}$ represents control timing of the capacitor. In the case of the column $V_{PIX[2,1]}$, the output value of the comparator was changed during the operation of the switch coupled to the capacitor $C_{R1}$, which indicates that the MSB information copied from the previous column pixel signal value is valid and the value of the current column pixel signal can be analog-digital converted through the remaining LSB information. Therefore, the LSB analog-digital conversion mode may be performed. In the case of the column $V_{PIX[2,2]}$, the LSB analog-digital conversion mode may be performed, but the MSB information of "+1" may be updated into the 2-MSB information. Furthermore, in the case of the column $V_{PIX[2,3]}$, the output value of the comparator was not changed in the $V_{RC}$ period, which indicates that the MSB information is not valid. Therefore, the full analog-digital conversion mode may be performed.

FIG. 6A is an example of a schematic configuration diagram of the shared circuit 530 illustrated in FIG. 5A, FIG. 6B illustrates an example of a LSB analog-digital conversion operation of the shared circuit, and FIG. 6C illustrates an example of a full analog-digital conversion operation of the shared circuit. FIG. 6B shows that the MSB information is provided from the shared MSB storage and update circuit 532 (see the dark lines from the shared MSB storage and update circuit 532 to the shared storage circuit 534) for the LSB analog-digital conversion. FIG. 6B shows that the comparison values corresponding to MSBs are provided from information from the shared SAR operation logic circuit 531 for the full analog-digital conversion (see the dark lines from the shared SAR operation logic circuit to the shared storage circuit 534).

The shared SAR operation logic circuit 531 which is a controller for controlling the analog-digital conversion operation may control the operation based on the LSB analog-digital conversion mode or the full analog-digital conversion mode according to the output value of the analog-digital conversion mode decision circuit 520.

The shared MSB storage circuit of the shared MSB storage and update circuit 532 may store MSB information of the analog-digital conversion value of the previous column pixel signal. To conduct the analog-digital converting of the current pixel signal, the MSBs of the analog-digital conversion value of the previous column pixel signal may be provided or copied to the shared storage circuit 534 from the shared MSB storage and update circuit 532, such that the reference voltage corresponding to the MSBs of the analog-digital conversion value of the previous column pixel signal is generated by the shared C-DAC 535. The shared MSB update circuit of the shared MSB storage and update circuit 532 may update the MSB information (MSBs) according to the comparison result value of the comparison circuit 510 through the operations of the capacitors $C_{R1}$ and $C_{R2}$ of the shared C-DAC 535 in the timing period $V_{RC}$, the comparison result value being stored in the first and second analog-digital conversion mode deciders 521 and 522 at each column. In some implementations, the first and second analog-digital conversion mode deciders 521 and 522 can recognize the result of 'current $V_{PIX}-(V_{DAC\_MSB} \pm \Sigma_1^z V_{DAC\_MSB} + V_{DAC\_WN})$' through the operation timings of the capacitors $C_{R1}$ and $C_{R2}$ and the comparison result value of the comparison circuit 510, when the shared ranging circuit 533 is operated. The $V_{DAC\_MSB}$ represent the reference voltage level corresponding to the MSBs of the previous column, and $V_{DAC\_WN}$ represents the reference voltage level corresponding to the LSBs. According to the result value, an input signal may be applied to the shared MSB update circuit of the shared MSB storage and update circuit 532 through the shared SAR operation logic circuit 531.

The shared ranging circuit 533 may be operated in the timing period $V_{RC}$, and the capacitors of the shared C-DAC 535 may be sequentially selected from the capacitor $C_{R1}$ through the shared storage circuit 534. In this case, the shared C-DAC 535 may sequentially generate the corresponding voltage values $V_{DAC\_WN}$. The comparison circuit 510 may compare the current column pixel signal to ($V_{DAC\_MSB}$ of the previous column pixel signal $\pm V_{DAC\_WN}$), which is generated through the capacitor $C_R$, and output the comparison result value to the analog-digital conversion mode decision circuit 520. Then, the analog-digital conversion mode decision circuit 520 may determine whether $V_{DAC\_MSB}$ of the previous column pixel signal is valid, and decide whether to perform the analog-digital conversion using $V_{DAC\_MSB}$ of the previous column pixel signal (i.e., the LSB analog-digital conversion mode) or whether to perform the SAR operation without using $V_{DAC\_MSB}$ of the previous column pixel signal (i.e., the full analog-digital conversion mode). The determination result value may be inputted to the shared SAR operation logic circuit 531 to control the shared storage circuit 534. The shared ranging circuit 533 can determine the position of the pixel signal at each column by raising the capacitors $C_{R1}$ to $C_{Rn}$ of the capacitor array one by one, and the timing period $V_{RC}$ may indicate a period in which the ADCs of all columns are operated at the same time. In the present embodiment, it is possible to reduce the number of absolute clocks by sharing the timing period $V_{RC}$ as illustrated in FIG. 5B, unlike the timing of FIG. 4B.

The shared storage circuit 534 may store the comparison result value of the comparison circuit 510 and output the comparison result value as the analog-digital conversion value. According to the comparison value stored therein, the shared storage circuit 534 may set the voltage levels of the capacitors of the shared C-DAC 535. In some implementations, the shared storage circuit 534 may include latches for storing the MSBs, latches for storing the LSBs, and latches for storing the ranging control value.

The shared C-DAC 535 may include a binary weighted capacitor array including the capacitors $C_{n-1}(C*2^{n-1})$ to $C_{n-m}(C*2^0)$. The shared C-DAC 535 may additionally include the capacitor array of the capacitors $C_{R1}$ and $C_{R2}$ to generate the voltage $V_{DAC\_WN}$ in the timing period $V_{RC}$ in which the MSBs of the analog-digital conversion value of the previous column pixel signal are copied and compared to the value of the current column pixel signal, in order to determine the validity of the MSBs. Furthermore, the shared C-DAC 535 may include the switch $SW_{UPDATE}$ for resetting charges. Here, "n" may represent the analog-digital conversion bit format, and "m" may correspond to "n-1." At this time, the number of the capacitors $C_{R1}$ and $C_{R2}$ may be increased according to the number of operations at the timing $V_{RC}$. Even though the previous column pixel signal and the current column pixel signal are close to each other, a difference between the voltage $V_{DAC\_MSB}$ corresponding to the MSBs and the pixel signal voltage value of the current column may occur at the timing $V_{RC}$, when only the MSBs of the analog-digital conversion value of the previous column pixel signal are copied and used. It may seem as if the difference exceeded the maximum value of the remaining LSBs excluding the MSBs. In the configuration where the MSBs of the analog-digital conversion value of the previous column pixel signal are used as the MSBs of the analog-digital conversion value of the current column pixel signal during the analog-digital converting of the current column pixel signal and the remaining LSBs are determined through an SAR operation, it may seem as if the MSBs of the analog-digital conversion value of the previous column pixel signal are not valid during the validity checking operation at the timing $V_{RC}$. Therefore, the validity checking range can be expanded such that the number and magnitude of voltage generations may be based on the size and number of capacitors $C_R$. In some implementations, the size of the capacitor $C_R$ may be decided to correspond to the 1 MSB step, i.e. the total of the remaining LSBs, or selectively set to be more than the 1 MSB step.

In accordance with the present embodiment, the C-DAC may be shared by a plurality of columns, for example, two or three columns. The structure of sharing of the C-DAC among the plurality of columns is different from the structure in which the SAR ADC includes one C-DAC for one comparator. Therefore, the area issue of the SAR ADC can be minimized, and the power efficiency and operating speed can be improved.

Furthermore, the disclosed technology enables to minimize an increase in number of clocks which are generated when the analog-digital conversion value of the previous column pixel signal is used for analog-digital converting the current column pixel signal.

Furthermore, it is possible to easily implement a high-resolution ADC.

Although various embodiments of the disclosed technology have been described for illustrative purposes, it will be apparent to those skilled in the art that various changes and modifications may be made based on what is disclosed and illustrated.

What is claimed is:

1. A successive approximation register (SAR) analog-digital converter (ADC) comprising:
    a comparison circuit coupled to an array of pixels arranged in rows and columns to receive a first pixel signal and a second pixel signal from a first column and a second column, respectively, and structured to compare each of the first and second pixel signals with a reference voltage and output comparison signals;
    an analog-digital conversion mode decision circuit located to receive the comparison signals from the comparison circuit and structure to provide a mode decision value which decides an analog-digital conversion mode out of different analog-digital conversion modes based on the comparison signals from the comparison circuit; and
    a shared circuit shared by the first and second columns, and structured to generate the reference voltage based on the comparison signals from the comparison circuit and the mode decision value from the analog-digital conversion mode decision circuit, the shared circuit outputting the reference voltage to the comparison circuit.

2. The SAR ADC of claim 1, wherein the analog-digital conversion mode is either an LSB (Least Significant Bit) analog-digital conversion in which only some of bits of an analog-digital conversion value of a target pixel signal are converted or a full analog-digital conversion in which all bits of the analog-digital conversion value of the target pixel signal are analog-digital converted.

3. The SAR ADC of claim 1, wherein the comparison circuit comprises:
    a first comparator located to receive the first pixel signal from the first column and structured to compare the first pixel signal with the reference voltage from the shared circuit, and output a first comparison signal; and
    a second comparator located to receive the second pixel signal and structured to compare the second pixel signals with the reference voltage from the shared circuit, and output a second comparison signal.

4. The SAR ADC of claim 3,
    wherein the analog-digital conversion mode decision circuit comprises:
    a first analog-digital conversion mode decider located to receive the first comparison signal from the comparison circuit and structured to decide the analog-digital conversion mode based on the received first comparison signal and a value obtained by comparing most significant bits (MSBs) of an analog-digital conversion value of a previous column pixel signal with a current column pixel signal; and
    a second analog-digital conversion mode decider located to receive the second comparison signal from the comparison circuit and structured to decide the analog-digital conversion mode based on the received second comparison signal and the value obtained by comparing the MSBs of the analog-digital conversion value of a previous column pixel signal with a current column pixel signal.

5. The SAR ADC of claim 1, wherein the analog-digital conversion mode decision circuit provides the mode decision value based on a comparison between the first pixel signal and a previous column pixel signal prior to the first pixel signal or between the second pixel signal and another previous column pixel signal prior to the second pixel signal.

6. The SAR ADC of claim 1, wherein the shared circuit comprises:
    a shared SAR operation logic circuit located to receive the mode decision value from the analog-digital conversion mode, and configured to output a control signal to conduct the LSB analog-digital conversion or full analog-digital conversion;
    a shared MSB storage and update circuit receiving the control signal from the shared SAR operation logic circuit and storing MSB information of an analog-digital conversion value of the first pixel signal;
    a shared ranging circuit receiving the control signal from the shared SAR operation logic circuit and outputting a ranging control value for generating the reference voltage;
    the shared storage circuit receiving the ranging control value from the shared ranging circuit and outputting an analog-digital conversion value including the MSB information and a LSB information; and
    a shared capacitor digital-analog converter (C-DAC) receiving the analog-digital conversion value from the shared storage circuit and generating the reference voltage.

7. The SAR ADC of claim 6, wherein the shared SAR operation logic circuit conduct the LSB analog-digital conversion or full analog-digital conversion according to the output values of the comparison circuit and the analog-digital conversion mode decision circuit,
    wherein the shared MSB storage and update circuit copies the MSB information of the analog-digital conversion value to the shared storage circuit and updates the MSB information according to a comparison result value of the comparison circuit,
    wherein the shared ranging circuit outputs the value obtained by comparing the MSB information of an analog-digital conversion value of a previous column pixel signal with a current column pixel signal,
    wherein the shared storage circuit stores the comparison result value of the comparison circuit, and
    wherein the shared C-DAC outputs the reference voltage to a first comparator and a second comparator of the comparison circuit.

8. The SAR ADC of claim 6, wherein the shared storage circuit stores at least one of the MSB information, the LSB information, or the ranging control value.

9. The SAR ADC of claim 6, wherein the MSBs information corresponds to a common voltage value for conducting an analog-digital conversion of the first pixel signal.

10. The SAR ADC of claim 6, wherein the MSB information corresponds to a pixel signal code value of a previous row that is prior to a current row.

11. The SAR ADC of claim 1, wherein the first column and the second column are selected during a same period and a validity of MSBs of a previous signal is checked during the same period.

12. The SAR ADC of claim 1,
wherein the comparison circuit is coupled to further receive a third pixel signal from a third column and structured to compare the third pixel signal with the reference voltage, and
the shared circuit is shared by the third circuit.

13. A successive approximation register (SAR) analog-digital converter (ADC) system comprising:
a comparison circuit coupled to an array of pixels arranged in rows and columns to receive a first pixel signal and a second pixel signal from a first column and a second column, respectively, and structured to compare each of the first and second pixel signals with a reference voltage and output comparison signals;
an analog-digital conversion mode decision circuit located to receive the comparison signals from the comparison circuit and structure to provide a mode decision value which decides an analog-digital conversion mode out of different analog-digital conversion modes based on the comparison signals from the comparison circuit; and
a shared circuit shared by the first and second columns, and structured to generate the reference voltage based on the comparison signals from the comparison circuit and the mode decision value from the analog-digital conversion mode decision circuit, the shared circuit outputting the reference voltage to the comparison circuit; and
a shared column selection circuit providing a column selection signal to the comparison circuit to enable the first column or the second column, the shared column selection circuit configured to control the analog-digital conversion mode decision circuit and the shared circuit.

14. The SAR ADC system of claim 13, wherein the comparison circuit comprises:
a first comparator located to receive the first pixel signal and structured to compare the first pixel signal with the reference voltage from the shared circuit, and output a first comparison signal; and
a second comparator located to receive the second pixel signal and structured to compare the second pixel signal with the reference voltage from the shared circuit, and outputting a second comparison signal.

15. The SAR ADC system of claim 13, wherein the analog-digital conversion mode decision circuit comprises:
a first analog-digital conversion mode decider located to receive the first comparison signal from the comparison circuit and structured to decide the analog-digital conversion mode based on the received first comparison signal and a value obtained by comparing MSBs of an analog-digital conversion value of the first pixel signal and the second pixel signal; and
a second analog-digital conversion mode decider located to receive the second comparison signal from the comparison circuit and structured to decide the analog-digital conversion mode based on the received second comparison signal and the value obtained by comparing the MSBs of the analog-digital conversion value of the first pixel signal and the second pixel signal.

16. The SAR ADC system of claim 13, wherein the shared circuit comprises:
a shared SAR operation logic circuit located to receive the mode decision value from the analog-digital conversion mode, and configured to output a control signal to conduct the LSB analog-digital conversion or full analog-digital conversion operation;
a shared MSB storage and update circuit receiving the control signal from the shared SAR operation logic circuit and storing MSB information of an analog-digital conversion value of the first pixel signal;
a shared ranging circuit receiving the control signal from the shared SAR operation logic circuit and outputting a ranging control value for generating the reference voltage;
the shared storage circuit receiving the ranging control value from the shared ranging circuit and outputting an analog-digital conversion value including the MSB information and a LSB information; and
a C-DAC receiving the analog-digital conversion value from the shared storage circuit and generating the reference voltage.

17. The SAR ADC system of claim 13, wherein the shared SAR operation logic circuit conduct the LSB analog-digital conversion or full analog-digital conversion according to the output values of the comparison circuit and the analog-digital conversion mode decision circuit,
wherein the shared MSB storage and update circuit copies the MSB information of the analog-digital conversion value to the shared storage circuit and updates the MSB information according to a comparison result value of the comparison circuit,
wherein the shared ranging circuit outputs the value obtained by comparing the MSB information of an analog-digital conversion value of a previous column pixel signal with a current column pixel signal,
wherein the shared storage circuit stores the comparison result value of the comparison circuit, and
wherein the shared C-DAC outputs the reference voltage to a first comparator and a second comparator of the comparison circuit.

18. The SAR ADC system of claim 16, wherein the shared storage circuit stores at least one of the MSB information, the LSB information, or the ranging control value.

19. The SAR ADC system of claim 16, wherein the MSB information corresponds to a common voltage value for conducting an analog-digital conversion of the first pixel signal.

20. The SAR ADC system of claim 16, wherein the MSB information corresponds to a pixel signal code value of a previous row that is prior to a current row.

21. The SAR ADC system of claim 13, wherein the first column and the second column are selected during a same period and a validity of MSBs of a previous signal is checked during the same period.

* * * * *